(12) United States Patent
Wang et al.

(10) Patent No.: US 11,911,807 B2
(45) Date of Patent: Feb. 27, 2024

(54) METHOD AND APPARATUS FOR CLEANING SUBSTRATES

(71) Applicant: ACM Research (Shanghai) Inc., Shanghai (CN)

(72) Inventors: Hui Wang, Shanghai (CN); Xi Wang, Shanghai (CN); Fuping Chen, Shanghai (CN); Xiaoyan Zhang, Shanghai (CN); Fufa Chen, Shanghai (CN)

(73) Assignee: ACM RESEARCH (SHANGHAI), INC., Shanghai (CN)

( * ) Notice: Subject to any disclaimer, the term of this patent is extended or adjusted under 35 U.S.C. 154(b) by 0 days.

(21) Appl. No.: 16/967,963

(22) PCT Filed: Feb. 7, 2018

(86) PCT No.: PCT/CN2018/075550
§ 371 (c)(1),
(2) Date: Aug. 6, 2020

(87) PCT Pub. No.: WO2019/153134
PCT Pub. Date: Aug. 15, 2019

(65) Prior Publication Data
US 2021/0394239 A1 Dec. 23, 2021

(51) Int. Cl.
| B08B 3/12 | (2006.01) |
| B08B 3/08 | (2006.01) |
| H01L 21/02 | (2006.01) |
| H01L 21/67 | (2006.01) |

(52) U.S. Cl.
CPC .................. *B08B 3/12* (2013.01); *B08B 3/08* (2013.01); *H01L 21/02057* (2013.01); *H01L 21/67051* (2013.01); *H01L 21/67098* (2013.01); *B08B 2220/00* (2013.01); *B08B 2240/00* (2013.01)

(58) Field of Classification Search
CPC ......... B08B 3/12; B08B 3/08; B08B 2220/00; B08B 2240/00; H01L 21/02057; H01L 21/67051; H01L 21/67098
See application file for complete search history.

(56) References Cited

U.S. PATENT DOCUMENTS

| 5,427,622 A | 6/1995 | Stanasolovich et al. |
| 6,058,945 A | 5/2000 | Fujiyama et al. |
| (Continued) | | |

FOREIGN PATENT DOCUMENTS

| CA | 2206139 C | 7/2003 |
| CN | 1166693 A | 12/1997 |
| (Continued) | | |

OTHER PUBLICATIONS

Machine translation of TW-498471-B (Year: 2002).*
(Continued)

*Primary Examiner* — Erin F Bergner
(74) *Attorney, Agent, or Firm* — Osha Bergman Watanabe & Burton LLP (57) ABSTRACT

The present invention provides a method for cleaning substrates comprising the steps of: placing a substrate on a substrate holder; implementing a bubble less or bubble-free pre-wetting process for the substrate; and implementing an ultra/mega sonic cleaning process for cleaning the substrate.

11 Claims, 10 Drawing Sheets

(56) References Cited

U.S. PATENT DOCUMENTS

| | | | | |
|---|---|---|---|---|
| 6,138,698 | A * | 10/2000 | Tanaka | B08B 3/12 |
| | | | | 134/184 |
| 2006/0042651 | A1* | 3/2006 | Verhaverbeke | C11D 11/0047 |
| | | | | 134/1 |
| 2010/0224215 | A1 | 9/2010 | Mertens et al. | |
| 2012/0052204 | A1 | 3/2012 | Puch et al. | |
| 2013/0171833 | A1* | 7/2013 | Buckalew | H01L 21/67051 |
| | | | | 438/758 |
| 2014/0230860 | A1* | 8/2014 | Chua | H01L 21/02052 |
| | | | | 134/144 |
| 2017/0243839 | A1* | 8/2017 | Buckalew | H01L 25/105 |

FOREIGN PATENT DOCUMENTS

| | | |
|---|---|---|
| JP | S62-165939 A | 7/1987 |
| JP | S63-10531 A | 1/1988 |
| JP | H04-311035 A | 11/1992 |
| JP | 2004-235559 A | 8/2004 |
| JP | 2008-198994 A | 8/2008 |
| TW | 498471 B * | 8/2002 ............. H01L 24/11 |
| WO | 2016183811 A1 | 11/2016 |

OTHER PUBLICATIONS

Search Report issued in Singaporean Application No. 11202007405T, dated Nov. 1, 2021 (12 pages).

International Search Report issued in International Application No. PCT/CN2018/075550 dated Nov. 15, 2018 (3 pages).

Written Opinion issued in International Application No. PCT/CN20181075550 dated Nov. 15, 2018 (4 pages).

Office Action issued in corresponding KR Application No. 10-2020-7025255 with English translation dated Jul. 15, 2022 (10 pages).

Office Action issued in corresponding CN Application No. 201880088255.4 dated Feb. 15, 2023 (10 pages).

\* cited by examiner

METHOD AND APPARATUS FOR CLEANING SUBSTRATES

FIELD OF THE INVENTION

The present invention generally relates to method and apparatus for cleaning substrate. More particularly, relates to a pre-treatment process before sonic energy is applied to clean a substrate to avoid bubbles damaging implosion during the substrate cleaning process, so as to remove fine particles more efficiently in patterned structures on the substrate.

BACKGROUND

Semiconductor devices are manufactured or fabricated on semiconductor substrates using a number of different processing steps to create transistor and interconnection elements. Recently, the transistors are built from two dimensions to three dimensions such as finFET transistors and 3D NAND memory. To electrically connect transistor terminals associated with the semiconductor substrate, conductive (e.g., metal) trenches, vias, and the like are formed in dielectric materials as part of the semiconductor device. The trenches and vias couple electrical signals and power between transistors, internal circuit of the semiconductor devices, and circuits external to the semiconductor device.

In forming the finFET transistors and interconnection elements on the semiconductor substrate may undergo, for example, masking, etching, and deposition processes to form the desired electronic circuitry of the semiconductor devices. In particular, multiple masking and plasma etching step can be performed to form a pattern of finFET, 3D NAND flash cell and or recessed areas in a dielectric layer on a semiconductor substrate that serve as fin for the transistor and or trenches and vias for the interconnection elements. In order to removal particles and contaminations in fin structure and or trench and via post etching or photo resist ashing, a wet cleaning step is necessary. Especially, when device manufacture node migrating to 14 or 16 nm and beyond, the side wall loss in fin and or trench and via is crucial for maintaining the critical dimension. In order to reduce or eliminate the side wall loss, it is important to use moderate, dilute chemicals, or sometime de-ionized water only. However, the dilute chemical or de-ionized water usually is not efficient to remove the particles in the fin structure, 3D NAND hole and or trench and via. Therefore the mechanical force such as ultra or mega sonic is needed in order to remove those particles efficiently. Ultra sonic or mega sonic wave will generate bubble cavitation which applies mechanical force to substrate structure, the violent cavitation such as transit cavitation or micro jet will damage those patterned structures. To maintain a stable or controlled cavitation is key parameters to control the mechanical force within the damage limit and at the same time efficiently to remove the particles.

Figure 1A:
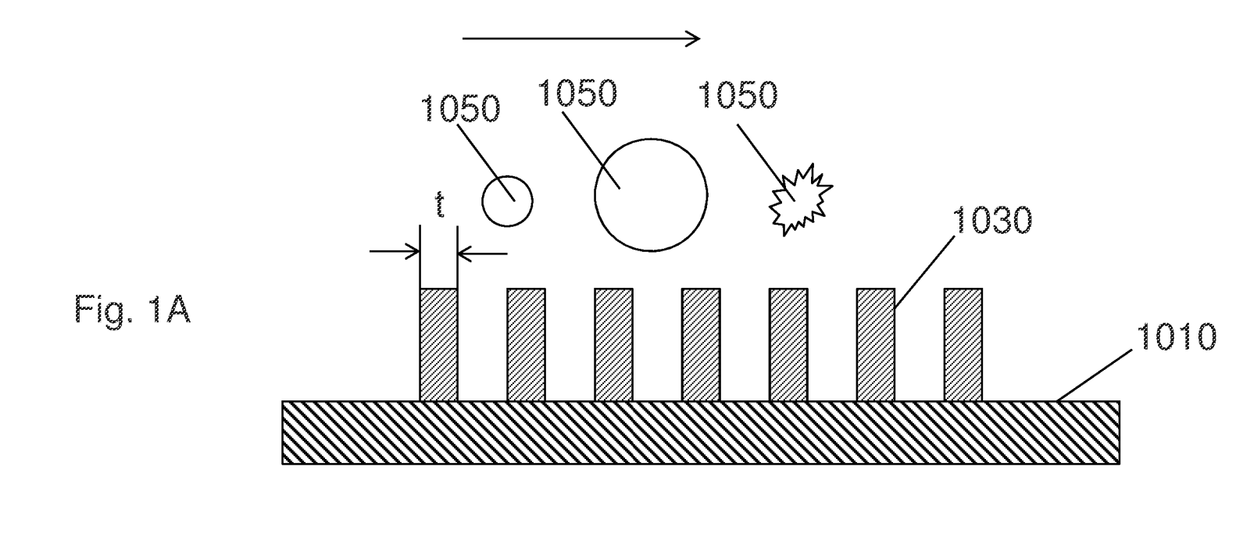
FIG. 1A and FIG. 1B depict a transit cavitation damaging patterned structures on a substrate during cleaning process.
Figure 1B:
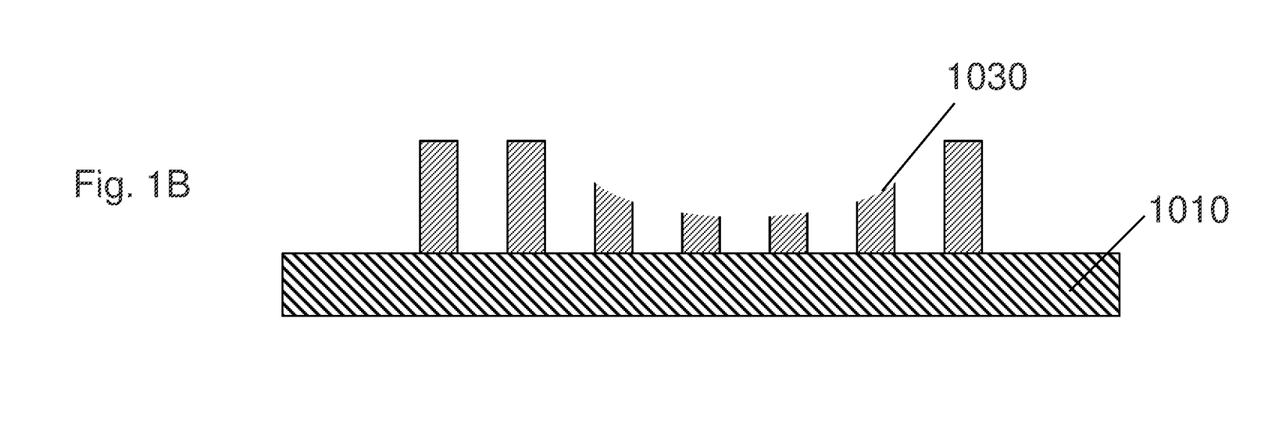

FIG. 1A and FIG. 1B depict a transit cavitation damaging patterned structures 1030 on a substrate 1010 during the substrate 1010 cleaning process. The transit cavitation may be generated by an acoustic energy applied for cleaning the substrate 1010. As shown in FIG. 1A and FIG. 1B, the micro jet caused by bubble 1050 implosion occurs above the top of the patterned structures 1030 and is very violent (can reaches a few thousands atmospheric pressures and a few thousands $^{\circ}$C), which can damage the fine patterned structures 1030 on the substrate 1010, especially when the feature size t shrinks to 70 nm and smaller.

The bubble cavitation damaging patterned structures on the substrate caused by the micro jet generated by bubble implosion has been conquered by controlling the bubble cavitation during the cleaning process. A stable or controlled cavitation on the entire substrate can be achieved to avoid the patterned structures being damaged, which has been disclosed in patent application No. PCT/CN2015/079342, filed on May 20, 2015.

In some case, even though the power intensity of an ultra or mega sonic applied for cleaning the substrate is reduced to a very low level (almost no particle removal efficiency), the damage of patterned structures on the substrate still occurs. The number of the damage is only a few (under 100). However, normally the number of the bubbles in the cleaning process under the ultra or mega sonic assisting process is tens of thousands. The numbers of the patterned structures damage on the substrate and the number of bubbles are not match. The mechanism of this phenomenon is unknown.

Figure 2A:
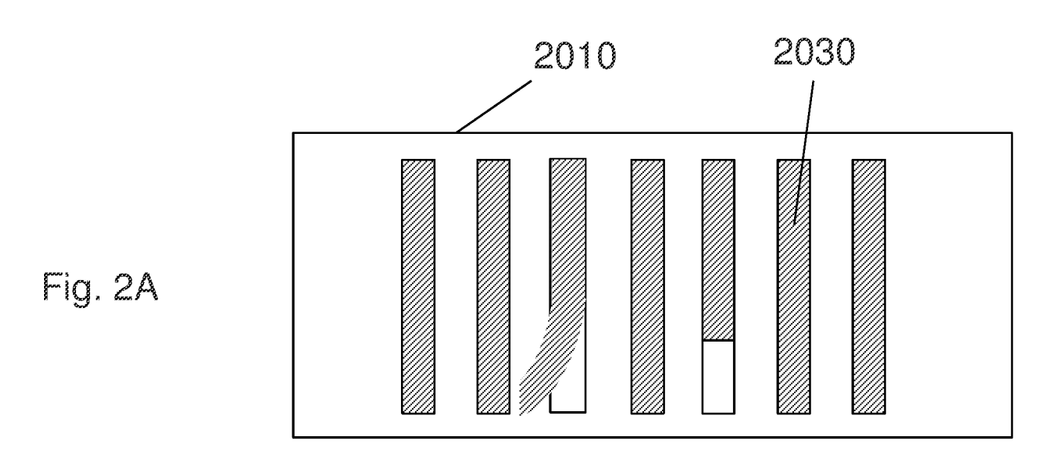
FIG. 2A to FIG. 2D depict the implosion of bubbles attached on the surface of patterned structures on a substrate damaging patterned structures.

Referring to FIG. 2A, during the ultra or mega sonic assisting substrate cleaning process, there is a phenomenon that even though the power intensity of an ultra or mega sonic applied for cleaning the substrate 2010 is reduced to a very low level (almost no particle removal efficiency), the damage of patterned structures 2030 on the substrate 2010 still occurs. What is more, it is often the case that single wall of the patterned structure 2030 is damaged. FIG. 2A illustrates the damage with two examples. One example is that single wall of the patterned structure 2030 is peeled toward a side. Another example is that a part of single wall of the patterned structure 2030 is removed. Although FIG. 2A illustrates two examples, it should be recognized that other similar damages may happen. What causes these damages?

Figure 2B:
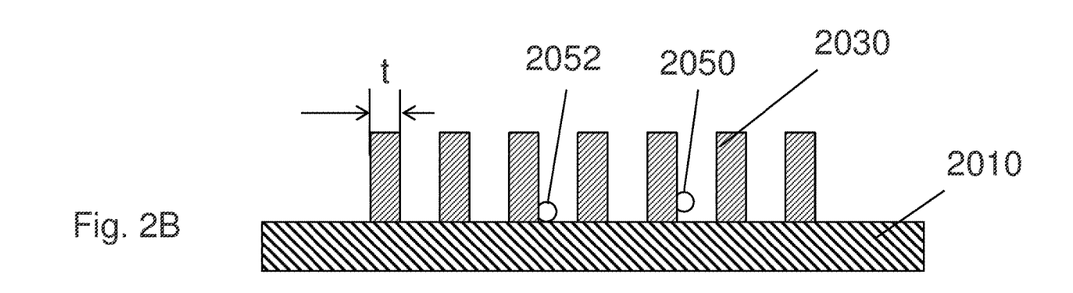
Figure 2C:
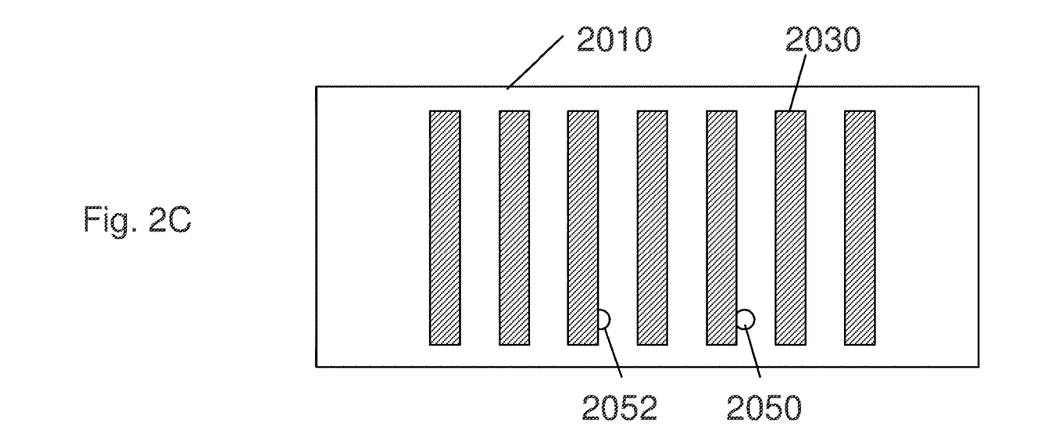
Figure 2D:
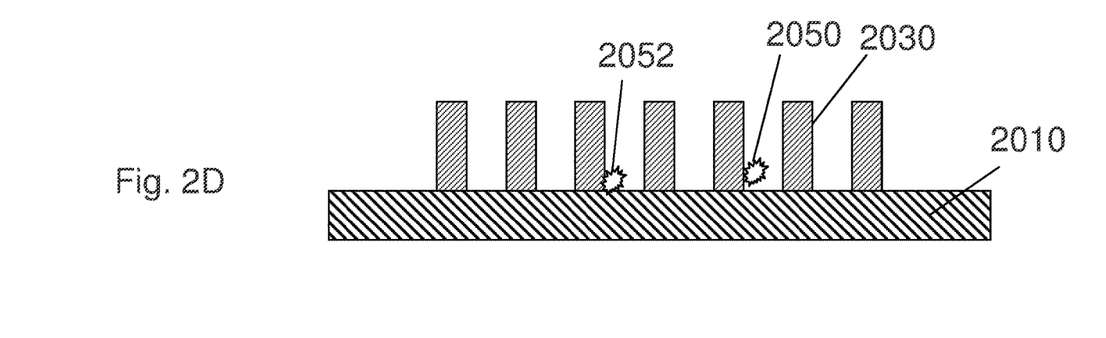

Referring to FIG. 2B to FIG. 2D, in the substrate cleaning process, small bubbles 2050, 2052 tend to attach on solid surface such as the surface of substrate 2010 or side walls of patterned structures 2030, as shown in FIG. 2B and FIG. 2C. When the bubbles 2050, 2052 are attached on the surface of substrate 2010 or side walls of patterned structures 2030, such as the bubble 2052 attaching on the bottom corner of the patterned structure 2030 and the bubble 2050 attaching on single side wall of the patterned structure 2030, once these bubbles 2050, 2052 implode, the patterned structures 2030 are peeled toward the direction in accord with the direction of bubble implosion force acting on the single side wall from the sub-layer on the substrate 2010 or a part of single side wall of the patterned structure 2030 is removed, as shown in FIG. 2A. Although the implosion is not as intense as the micro jet, however, due to the bubbles 2050, 2052 attaching on the surface of the substrate 2010 and the side walls of the patterned structures 2030, the energy generated by small bubbles implosion can also damage the patterned structures 2030.

Moreover, during a wet process, the small bubbles may coalesce into bigger bubbles. Due to the tendency of bubble attachment on the solid surface, the coalescence on the solid surface such as the surfaces of the patterned structures and the substrate increases the risk of the bubbles implosion happening on the patterned structures, in particular, the critical geometrical portion.

Figures 3A, 3B, 3C, 3D:
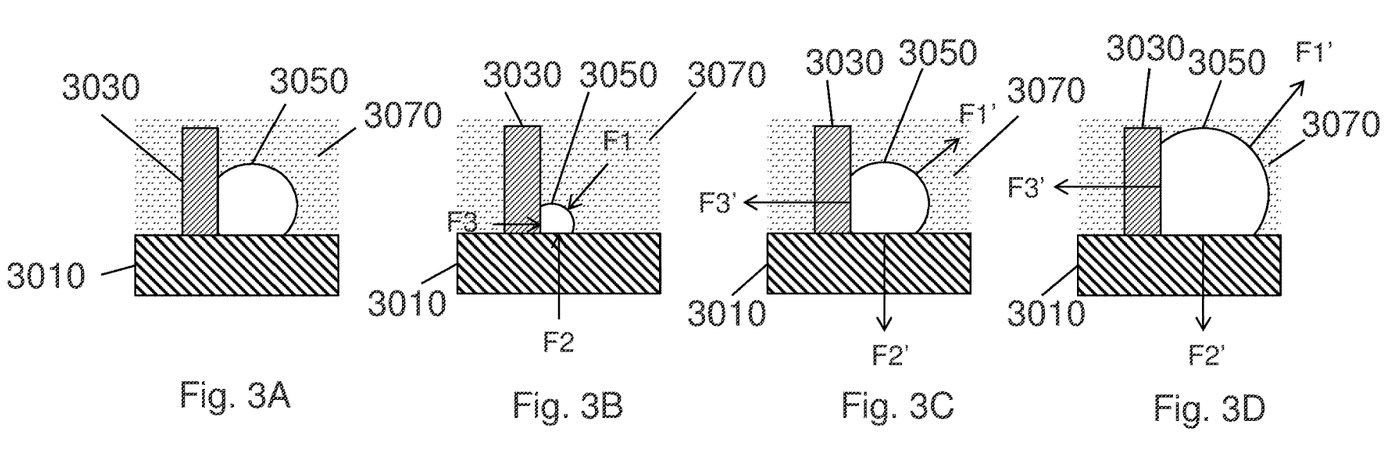
FIG. 3A to FIG. 3H depict the mechanism that the implosion of bubbles attached on the surface of patterned structures on a substrate damages patterned structures.
Figures 3E, 3F, 3G, 3H:
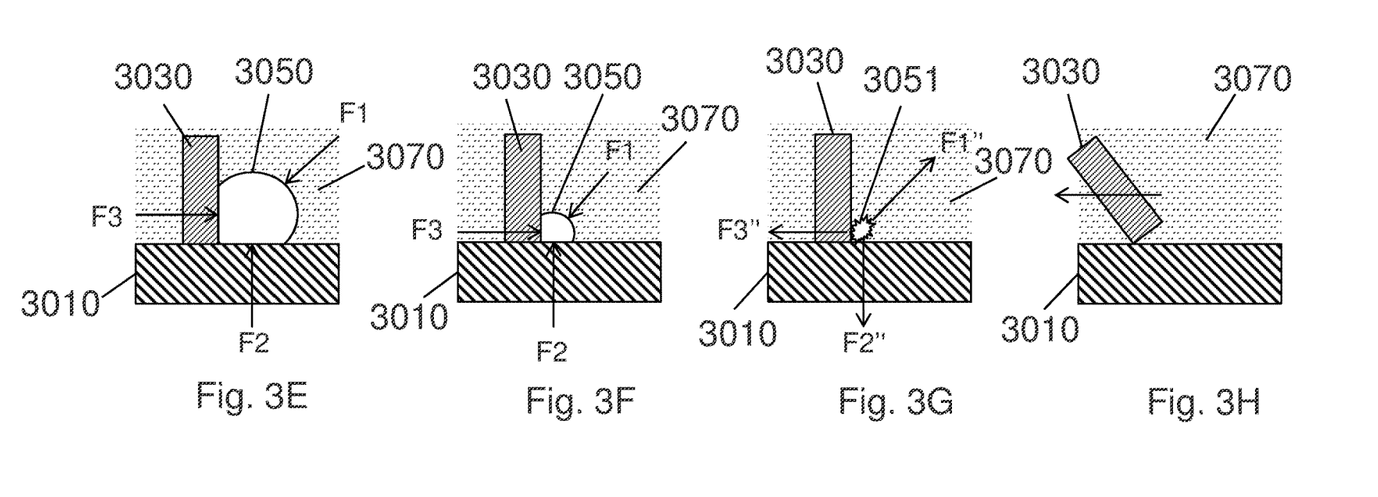

FIG. 3A to FIG. 3H depict the mechanism that the implosion of bubbles attached on a substrate damages patterned structures on the substrate during an ultra or mega sonic assist wet cleaning process according to the present invention. FIG. 3A illustrates cleaning liquid 3070 is delivered onto the surface of a substrate 3010 having patterned structures 3030 and at least one bubble 3050 is attached on the bottom corner of the patterned structure 3030. In a positive ultra or mega sonic working process shown in FIG. 3B, F1 is the ultra or mega sonic pressing force working on the bubble 3050, F2 is the counter force working on the bubble 3050 generated by the side wall of the patterned structure 3030 while the bubble 3050 pressing on the side wall of the patterned structure 3030, and F3 is the counter force working on the bubble 3050 generated by the substrate 3010 while the bubble 3050 pressing on the substrate 3010. In a negative ultra or mega sonic working process shown in FIG. 3C and FIG. 3D, the bubble 3050 is expanding due to the ultra or mega sonic negative force pulling the bubble 3050. In the process of the bubble volume expanding, F1' is the force of the bubble 3050 pushing the cleaning liquid 3070, F2' is the force of the bubble 3050 pushing the substrate 3010, and F3' is the force of the bubble 3050 pushing the side wall of the patterned structure 3030. After the positive ultra or mega sonic and the negative ultra or mega sonic are alternately applied for a number of cycles, the gas temperature inside of bubbles increases higher and higher, the bubble volume grows bigger and bigger, and the bubble implosion 3051 occurs finally, which generates the implosion force F1" acting on the cleaning liquid 3070, F2" acting on the substrate 3010, F3" acting on the side wall of the patterned structure 3030, as shown in FIG. 3G. The implosion force causes the side wall of the patterned structure 3030 being damaged as shown in FIG. 3H.

For avoiding the patterned structures on the substrate being damaged caused by bubble implosion during the ultra or mega sonic assist wet cleaning process, it is preferable to detaching the bubbles from the surfaces of the patterned structures and the substrate before the acoustic energy is applied to the cleaning liquid for cleaning the substrate, which has been disclosed in patent application No. PCT/CN2018/073723, filed on Jan. 23, 2018. However, it is difficult to detach all bubbles from the surface of the patterned structures. Therefore, the remaining bubbles on the surface of the patterned structures are still possible to cause damage to the patterned structures on the substrate.

SUMMARY

Accordingly, an object of the present invention is to provide methods and apparatuses for cleaning substrates.

According to one embodiment, a method for cleaning substrates includes the following steps: placing a substrate on a substrate holder; implementing a bubble less or bubble-free pre-wetting process for the substrate; and implementing an ultra/mega sonic cleaning process for cleaning the substrate.

According to one embodiment, an apparatus for cleaning substrates includes a first chamber connected to a pump to form a vacuum environment in the first chamber; a substrate holder set in the first chamber for holding the substrate; at least one sprayer configured to supply pre-wetting chemical solution or chemical mist onto the surface of the substrate; and a second chamber equipped with an ultra/mega sonic device for cleaning the substrate.

According to another embodiment, an apparatus for cleaning substrates includes a chamber connected to a pump to form a vacuum environment in the chamber; a substrate holder set in the chamber for holding the substrate; at least one nozzle configured to supply pre-wetting chemical solution or chemical mist onto the surface of the substrate to form a bubble less or bubble-free chemical liquid layer on the substrate after the chamber is vacuumized to form a vacuum environment in the chamber; and an ultra/mega sonic device configured to clean the substrate.

According to another embodiment, an apparatus for cleaning substrates includes a first chamber connected to a vaporized unit configured to vaporize pre-wetting chemical solution; a substrate holder set in the first chamber for holding the substrate; at least one sprayer connected to the vaporized unit for supplying vaporized liquid molecules onto the surface of the substrate to form a bubble less or bubble-free pre-wetting chemical liquid layer on the substrate; and a second chamber equipped with an ultra/mega sonic device for cleaning the substrate.

According to another embodiment, an apparatus for cleaning substrates includes a chamber; a vaporized unit configured to vaporize pre-wetting chemical solution; a substrate holder set in the chamber for holding the substrate; at least one sprayer connected to the vaporized unit for supplying vaporized liquid molecules onto the surface of the substrate to form a bubble less or bubble-free pre-wetting chemical liquid layer on the substrate; at least one nozzle configured to supply cleaning chemical solution or chemical mist onto the surface of the substrate for cleaning the substrate; and an ultra/mega sonic device configured to clean the substrate.

As described above, the present invention implements a bubble less or bubble-free pre-wetting process for the substrate before implementing an ultra/mega sonic cleaning process for cleaning the substrate, effectively preventing bubble implosion from causing damage to patterned structures on the substrate while implementing the ultra/mega sonic cleaning process. With the pre-treatment for the substrate, the bubbles do not tend to attach onto the surface of the patterned structures or the bubbles near the surface of the patterned structures will be easily removed outwards before they attach on the surface of the patterned structures. In this way, the bubble implosion is more controllable by the ultra/mega sonic powers control, while not affected by the bubbles accumulation or attachment on the surface of the patterned structures and the critical geometrical portion in particular.

DETAILED DESCRIPTION

Figure 4A:
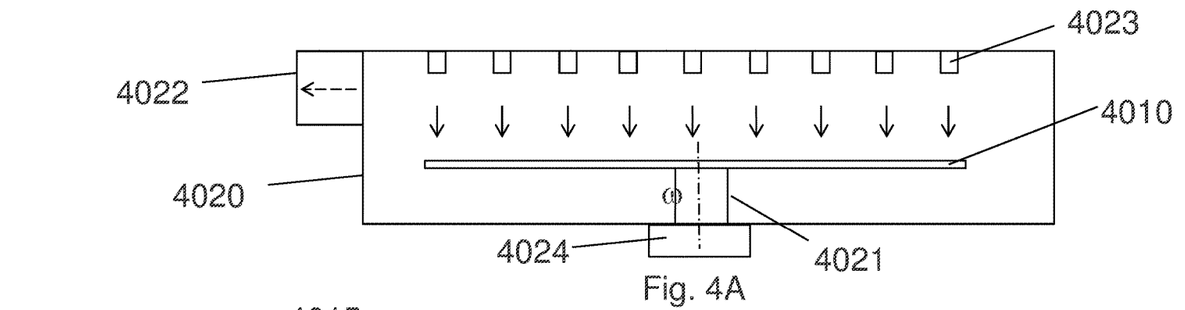
FIG. 4A and FIG. 4B depict an exemplary apparatus for cleaning substrates according to the present invention.
Figure 4B:
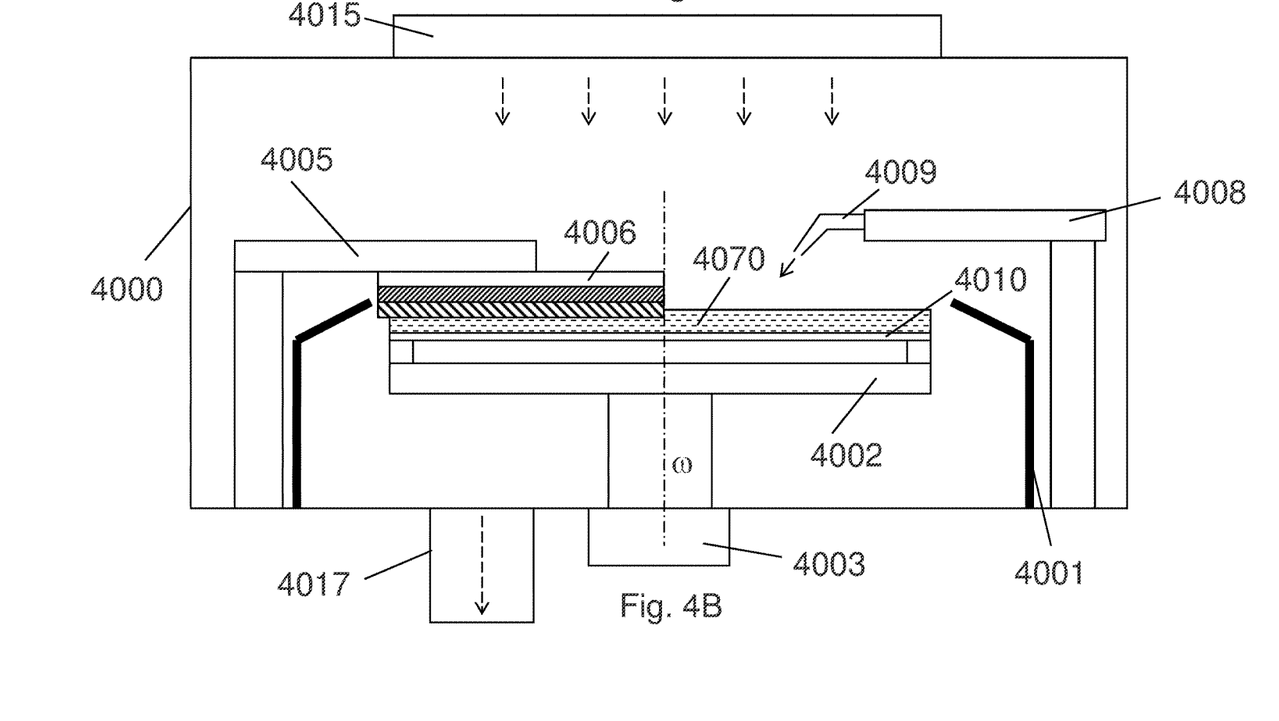

FIGS. 4A and 4B show an apparatus for cleaning substrates according to an exemplary embodiment of the present invention. The apparatus is capable of pre-treating the substrate to obtain a bubble less or bubble-free surface of the substrates before the subsequent ultra/mega sonic cleaning process. The apparatus comprises a pre-wet chamber 4020 and a cleaning chamber 4000. The substrate 4010 is pretreated in the pre-wet chamber 4020 for obtaining a bubble less or bubble-free pre-wetting surface of the substrate 4010, and then moved into the cleaning chamber 4000 for the subsequent ultra/mega sonic cleaning process. FIG. 4A shows the pre-wet chamber 4020. The pre-wet chamber 4020 includes a door for transferring the substrate 4010 into or out of the pre-wet chamber 4020, a vacuum port 4022 connected to a vacuum pump to generate a vacuum environment in the pre-wet chamber 4020, a substrate holder 4021 holding the substrate 4010 in the pre-wet chamber 4020, a rotating driving device 4024 driving the substrate 4010 to rotate, and at least one sprayer 4023 above the substrate 4010 to supply pre-wetting chemical solution or chemical mist to the surface of the substrate 4010 to form a bubble less or bubble-free chemical liquid layer on the substrate 4010. In one embodiment, pluralities of sprayers 4023 are used for the pre-wetting chemical solution uniform distribution on the surface of the substrate 4010. The vacuum degree in the pre-wet chamber 4020 is set at 25 Torr and above. FIG. 4B shows the cleaning chamber 4000. The cleaning chamber 4000 comprises a substrate holder 4002 holding the substrate 4010, a cleaning cup 4001 surrounding the substrate holder 4002 for preventing cleaning chemical solution 4070 from splash, a spin actuator 4003 connecting to the substrate holder 4002 for driving the substrate holder 4002 to rotate, a fan and filter unit 4015 setting on the top of the cleaning chamber 4000 to generate a down flow on the surface of the substrate 4010, at least one exhaust port 4017 at the bottom of the cleaning cup 4001, a swing arm 4005 mounted with an ultra/mega sonic device 4006 for imparting sonic energy to the cleaning chemical solution 4070 so as to cleaning the substrate 4010, a plurality of nozzle arms 4008 mounted with at least one nozzle 4009 to supply chemical solution, chemical mist or drying gas to the surface of the substrate 4010.

A method for cleaning substrates according to the present invention, comprising:

Step 1: transfer a substrate 4010 into the pre-wet chamber 4020, and the substrate 4010 is held by the substrate holder 4021.

Step 2: close the door of the pre-wet chamber 4020 and start to vacuumize the pre-wet chamber 4020 from the vacuum port 4022 to build a vacuum environment in the pre-wet chamber 4020 at a set time. The vacuum degree in the pre-wet chamber 4020 is set at 25 Torr and above.

Step 3: after the vacuum environment formation, rotate the substrate 4010 at 100-200 RPM, and supply the pre-wetting chemical solution or chemical mist on the surface of the substrate 4010.

Step 4: rotate the substrate 4010 at 400-600 RPM, then stop the substrate 4010 rotation and release the vacuum pressure in the pre-wet chamber 4020 and then open the door of the pre-wet chamber 4020.

Step 5: transfer the substrate 4010 from the pre-wet chamber 4020 to the cleaning chamber 4000 and the substrate 4010 is held by the substrate holder 4002 in the cleaning chamber 4000.

Step 6: spin the substrate 4010 at a set low rotation speed from 10 RPM to 1000 RPM.

Step 7: swing the nozzle arm 4008 to a position above the surface of the substrate 4010 to supply the cleaning chemical solution on the surface of the substrate 4010. A plurality of chemical solutions can be used in this step.

Step 8: supply the cleaning chemical solution on the surface of the substrate 4010 for ultra/mega sonic cleaning process.

Step 9: move down the ultra/mega sonic device 4006 to the substrate 4010 surface with certain height, and the gap between the ultra/mega sonic device 4006 and the substrate 4010 surface is filled with cleaning chemical solution as a sonic transferring media.

Step 10: turn on the ultra/mega sonic device 4006 to clean the substrate 4010 surface with a programed recipe at a certain time.

Step 11: turn off the ultra/mega sonic device 4006 and lift up the ultra/mega sonic device 4006.

Step 12: supply rinse chemical solution or DI water on the substrate 4010 surface for cleaning.

Step 13: dry the substrate 4010.

Step 14: stop the substrate 4010 rotation and get the substrate 4010 from the cleaning chamber 4000.

The step 2 to step 3 are target for a bubble less or bubble-free pre-wetting process. Since vacuumizing the gas such as air or $N_2$ from the pre-wet chamber 4020 to build a vacuum environment surrounding the substrate 4010 surface in the step 2, the pre-wetting chemical solution goes into vias, trenches and the like on the substrate 4010 without the blockage of gas bubbles in the step 3.

The step 7 to step 11 can be repeated with at least one cycle. And at least one type of chemical solution such as SC1 ($NH_4OH$, $H_2O_2$, $H_2O$ mixture), ozone water, ammonia can be used in this cleaning cycle.

In the cleaning steps from the step 6 to step 12, the substrate 4010 rotation speed can be set from 10 RPM to 1500 RPM by various time and controlled by programmable recipe.

Figure 5:
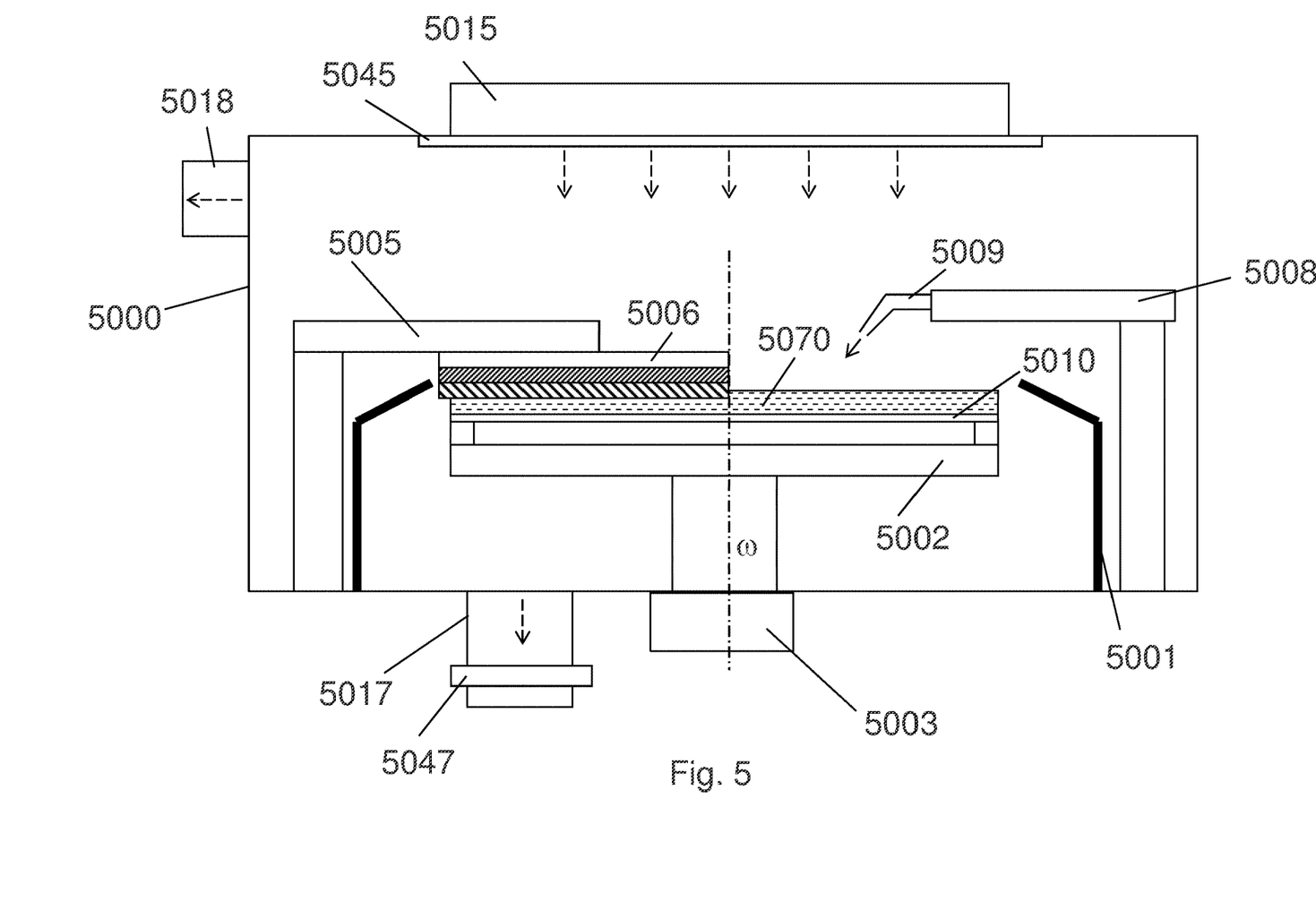
FIG. 5 depicts another exemplary apparatus for cleaning substrates according to the present invention.

FIG. 5 shows an apparatus for cleaning substrates according to another exemplary embodiment of the present invention. The apparatus is capable of pre-treating the substrate to obtain a bubble less or bubble-free surface of the substrates before the subsequent ultra/mega sonic cleaning process. The apparatus combines the pre-wet function and the cleaning function together in one cleaning chamber 5000, wherein the substrate is pre-treated for obtaining a bubble less or bubble-free pre-wetting surface of the substrate, and then cleaned by the subsequent ultra/mega sonic cleaning process. FIG. 5 shows the cleaning chamber 5000. The cleaning chamber 5000 comprises a cleaning cup 5001, a vacuum port 5018 connected to a vacuum pump to generate a vacuum environment in the cleaning chamber 5000, a spin actuator 5003, a substrate holder 5002, a fan and filter unit 5015 to generate a down flow on the substrate 5010 surface, at least one exhaust port 5017 at the bottom of the cleaning cup 5001, a first shutter 5047 for the exhaust port 5017 and a second shutter 5045 for the fan and filter unit 5015, a swing arm 5005 mounted with an ultra/mega sonic device 5006, a plurality of nozzle arms 5008 mounted with at least one nozzle 5009 to supply pre-wetting chemical solution or chemical mist, cleaning chemical solution or chemical mist, and drying gas to the substrate 5010 surface. When the vacuum port 5018 starts the work for vacuum pressure formation in the cleaning chamber 5000 in the process of pre-treatment, the fan and filter unit 5015 and the exhaust port 5017 stop generating the down flow on the substrate 5010 surface. The second shutter 5045 is closed to separate the fan and filter unit 5015 and the cleaning chamber 5000, and the first shutter 5047 is also closed to separate the exhaust port 5017 and the cleaning chamber 5000, so as to build the vacuumed environment in the cleaning chamber

5000. And then, in the cleaning process, the fan and filter unit 5015 and the exhaust port 5017 restart for the down flow generation.

Another method for cleaning substrates according to the present invention, comprising:

Step 1: transfer a substrate 5010 into the cleaning chamber 5000, and the substrate 5010 is held by the substrate holder 5002.

Step 2: close the door of the cleaning chamber 5000, and turn off the fan and filter unit 5015 and the exhaust port 5017, and close the first shutter 5047 and the second shutter 5045, and start to vacuumize the cleaning chamber 5000 from the vacuum port 5018 to build a vacuum environment in the cleaning chamber 5000 at a set time. The vacuum degree in the pre-wet chamber 4020 is set at 25 Torr and above.

Step 3: after the vacuum environment formation, spin the substrate 5010 at a set low rotation speed from 10 RPM to 1000 RPM.

Step 4: swing the pre-wetting nozzle to a position above the surface of the substrate 5010 to supply the pre-wetting chemical solution or chemical mist on the substrate 5010 surface.

Step 5: release the vacuum pressure in the cleaning chamber 5000 and turn on the fan and filter unit 5015 and the exhaust port 5017, the first shutter 5047 and the second shutter 5045 to form the down flow on the substrate 5010.

Step 6: swing the nozzle arm to a position above the surface of the substrate 5010 to supply the cleaning chemical solution 5070 on the substrate 5010 surface. A plurality of chemical solutions can be used in this step.

Step 7: supply the cleaning chemical solution on the substrate 5010 surface for ultra/mega sonic cleaning process.

Step 8: move down the ultra/mega sonic device 5006 to the substrate 5010 surface with certain height, and the gap between the ultra/mega sonic device 5006 and the substrate 5010 surface is filled with cleaning chemical solution as a sonic transferring media.

Step 9: turn on the ultra/mega sonic device 5006 to clean the substrate 5010 surface with a programed recipe at a certain time.

Step 10: turn off the ultra/mega sonic device 5006 and lift up the ultra/mega sonic device 5006.

Step 11: supply rinse chemical solution or DI water on the substrate 5010 for cleaning.

Step 12: dry the substrate 5010.

Step 13: stop the substrate 5010 rotation and get the substrate 5010 from the cleaning chamber 5000.

The step 2 to step 4 are target for a bubble less or bubble-free pre-wetting process. Since vacuumizing the gas such as air or $N_2$ from the cleaning chamber 5000 to build a vacuum environment surrounding the substrate 5010 surface in the step 2, the pre-wetting chemical solution goes into vias, trenches and the like on the substrate 5010 without the blockage of gas bubbles in the step 4.

The step 6 to step 10 can be repeated with at least one cycle. And at least one type of chemical solution such as SC1, ozone water, ammonia can be used in this cleaning cycle.

In the cleaning steps from the step 5 to step 11, the substrate 5010 rotation speed can be set from 10 RPM to 1500 RPM by various time and controlled by programmable recipe.

Figure 6A:
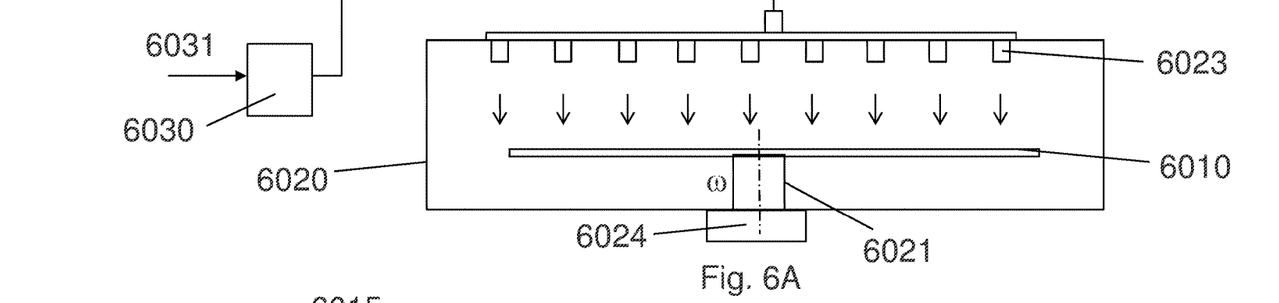
FIG. 6A and FIG. 6B depict an exemplary apparatus for cleaning substrates according to the present invention.
Figure 6B:
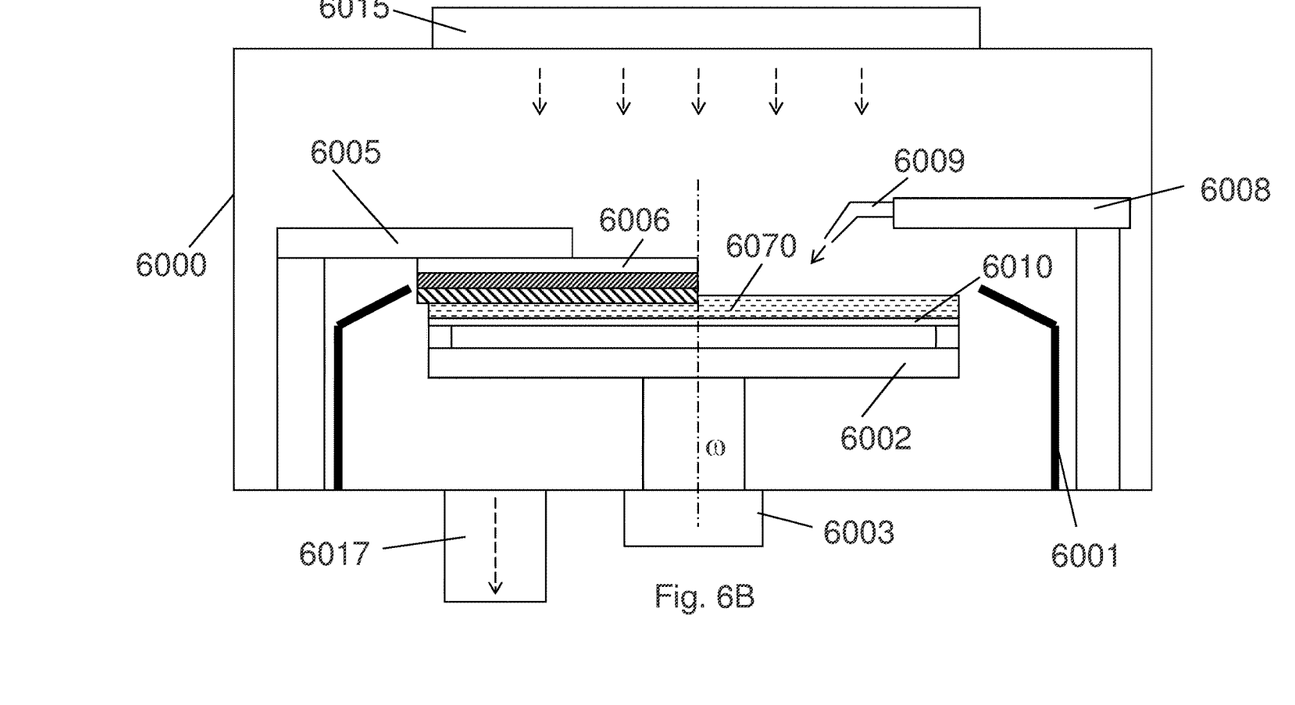

FIGS. 6A and 6B show an apparatus for cleaning substrates according to an exemplary embodiment of the present invention. The apparatus is capable of pre-treating the substrate to obtain a bubble less or bubble-free surface of the substrates before the subsequent ultra/mega sonic cleaning process. The apparatus comprises a pre-wet chamber 6020 and a cleaning chamber 6000. The substrate is pre-treated in the pre-wet chamber 6020 for obtaining a bubble less or bubble-free pre-wetting surface of the substrate, and then moved into the cleaning chamber 6000 for the subsequent ultra/mega sonic cleaning process. FIG. 6A shows the pre-wet chamber 6020. The pre-wet chamber 6020 comprises a vaporized unit 6030 configured to vaporize the pre-wetting liquid chemical solution 6031 to vapor phase molecules, a rotating driving device 6024 configured to drive the substrate 6010 to rotate, at least one sprayer 6023 configured to connect to the vaporized unit 6030 and dispense the vaporized liquid molecules to the substrate 6010 surface to form a bubble less or bubble-free pre-wetting chemical liquid layer on the substrate, and a substrate holder 6021 configured to hold the substrate 6010 in the pre-wet chamber 6020. In one embodiment, pluralities of sprayers 6023 are used for the vaporized liquid molecules uniform distribution on the substrate 6010 surface. The vaporized unit 6030 is used for vaporizing the liquid phase pre-wetting chemical solution 6031 to gas molecules. In one embodiment, the vaporized unit 6030 transforms the pre-wetting chemical solution 6031 to gas phase molecules by a sonic generating method. While using the sonic generating method to form the chemical liquid vapor, the chemical liquid vapor is heated to a temperature higher than the temperature of the substrate 6010. Alternatively, the substrate 6010 is cooled to a temperature lower than the temperature of the chemical liquid vapor. In another embodiment, the vaporized unit 6030 transforms the pre-wetting chemical solution 6031 to gas phase molecules by a thermal heating method. And the vaporized liquid molecules also can be carried by some media gas such as $N_2$, air, ozone, $NH_3$, $H_2$ and He etc. The carrying gas could be noble gas only for the vaporized liquid molecules carrying or active gas to assist the vaporized liquid molecules for substrate surface oxidation or passivation.

Figure 8A:
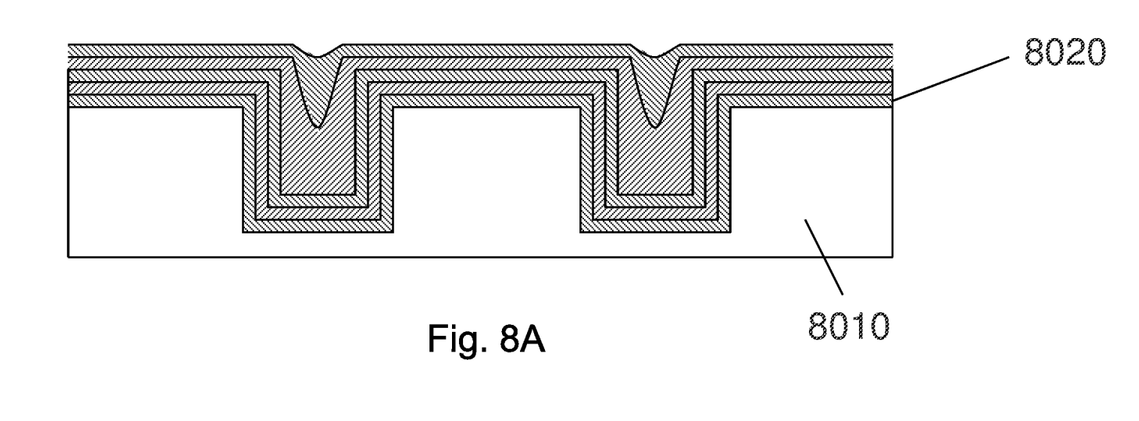
FIG. 8A and FIG. 8B depict an exemplary method for cleaning substrates according to the present invention.
Figure 8B:
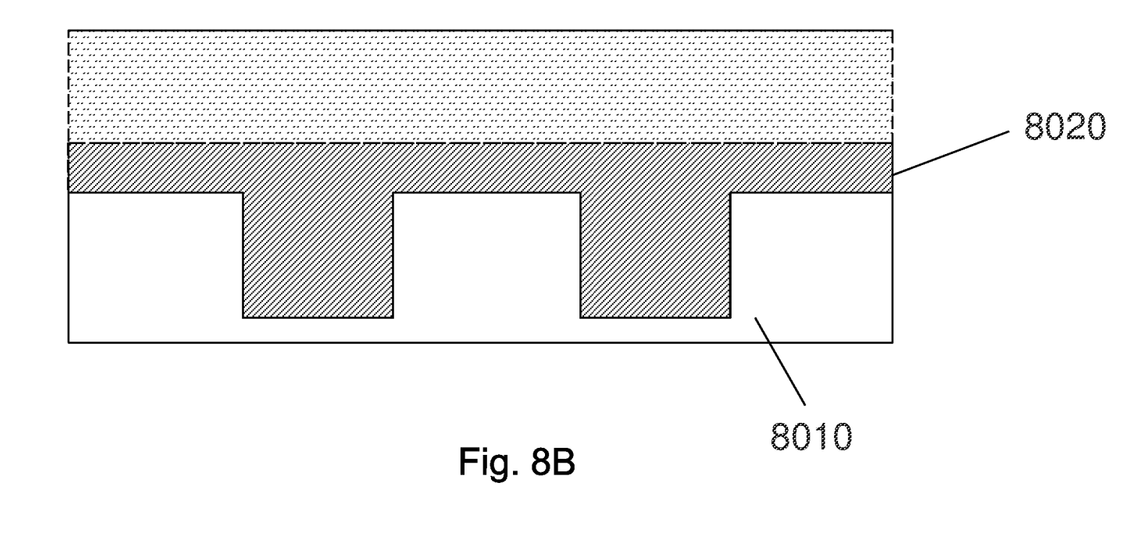

The vaporized liquid molecules are easier to be transported from bulk vapor environment into patterned structures such as vias and trenches on the substrate 6010. After the vaporized liquid molecules dispended on the substrate 6010 surface, the vaporized liquid molecules condense on the substrate 8010 surface to form a thin layer 8020 of pre-wetting liquid molecules, and the liquid molecules formation layer by layer from the bottom to the top in the vias and trenches on the substrate 8010 as shown in FIGS. 8A to 8B. However, this bottom-up liquid layers formation of the pre-wetting chemical molecules will be affected if the portion of the substrate surface is not wetted well, and the liquid layer will break apart at said portion due to the surface tension. In one embodiment, the liquid phase pre-wetting chemical solution containing the surfactant or additives is vaporized in the vaporized unit 6030 to the vaporized mixture liquid molecules containing the molecules of surfactant or additives. The vaporized mixture liquid molecules containing the molecules of surfactant or additives are capable of increasing the wettability of the liquid chemical solution on the substrate surface, so as to fill up the vias and trenches, etc. patterned structures on the substrate 6010 with the liquid chemical solution in a bottom-up way without blockage of bubbles. The chemical such as carboxyl-containing ethylendiamine tetraacetic acid (EDTA), tetracarboxyl compound-ethylenediamine tetrapropionic (EDTP) acid/salt, etc. is used as a surfactant doped in the liquid chemical solution to increase the wettability of the liquid chemical solution. In another embodiment, the liquid phase pre-wetting chemical solution containing a chemical for oxidizing the substrate 6010 surface from hydrophobic to hydrophilic is vaporized in the vaporized unit 6030 to the vaporized mixture liquid molecules. The vaporized mixture liquid molecules are capable of increasing the wettability of the liquid chemical solution on the substrate surface, so as to fill up the vias and trenches, etc. patterned structures on the substrate 6010 with the liquid chemical solution in a bottom-up way without blockage of bubbles. The chemical such as Ozone solution or SC1 solution ($NH_4OH$, $H_2O_2$, $H_2O$ mixture) is used to oxidize the hydrophobic surface material like Silicon or Ploy Silicon layer to hydrophilic Silicon oxide layer.

FIG. 6B shows the cleaning chamber 6000. The cleaning chamber 6000 comprises a cleaning cup 6001, a spin actuator 6003, a substrate holder 6002, a fan and filter unit 6015 to generate a down flow on the substrate 6010 surface, at least one exhaust port 6017 at the bottom of the cleaning cup 6001, a swing arm 6005 mounted with an ultra/mega sonic device 6006, a plurality of nozzle arms 6008 mounted with at least one nozzle 6009 to supply cleaning chemical solution, chemical mist or drying gas to the substrate 6010 surface.

A method for cleaning substrates according to the present invention, comprising:

Step 1: transfer a substrate 6010 into the pre-wet chamber 6020, and the substrate 6010 is held by the substrate holder 6021.

Step 2: supply the pre-wetting chemical solution to the vaporized unit 6030 for generation of the vaporized liquid molecules.

Step 3: close the door of the pre-wet chamber 6020, and then rotate the substrate 6010 and start to supply the vaporized liquid molecules from the sprayers 6023 on the substrate 6010 surface for the pre-wetting process.

Step 4: transfer the substrate 6010 from the pre-wet chamber 6020 to the cleaning chamber 6000 and the substrate 6010 is held by the substrate holder 6002.

Step 5: spin the substrate 6010 at a set low rotation speed from 10 RPM to 1000 RPM.

Step 6: swing the nozzle arm 6008 to a position above the surface of the substrate 6010 to supply the cleaning chemical solution on the substrate 6010 surface. A plurality of chemical solutions can be used in this step.

Step 7: supply the cleaning chemical solution on the substrate 6010 surface for ultra/mega sonic cleaning process.

Step 8: move down the ultra/mega sonic device 6006 to the substrate 6010 surface with certain height, and the gap between the ultra/mega sonic device 6006 and the substrate 6010 surface is filled with cleaning chemical solution as a sonic transferring media.

Step 9: turn on the ultra/mega sonic device 6006 to clean the substrate 6010 surface with a programed recipe at a certain time.

Step 10: turn off the ultra/mega sonic device 6006 and lift up the ultra/mega sonic device 6006.

Step 11: supply rinse chemical solution or DI water on the substrate 6010 for cleaning.

Step 12: dry the substrate 6010.

Step 13: stop the substrate 6010 rotation and get the substrate 6010 from the cleaning chamber 6000.

The step 2 to step 3 are target for a bubble less or bubble-free pre-wetting process. The vaporized liquid molecules are dispensed on the substrate 6010 surface, and the vaporized liquid molecules condense on the substrate 6010 surface to form a thin layer of pre-wetting liquid molecules, the liquid molecules formation layer by layer from bottom to top in the vias and trenches on the substrate 6010 surface.

The step 7 to step 10 can be repeated with at least one cycle. And at least one type of chemical solution such as SC1, ozone water, ammonia can be used in this cleaning cycle.

In the cleaning steps from step 6 to step 11, the substrate 6010 rotation speed can be set from 10 RPM to 1500 RPM by various time and controlled by programmable recipe.

Figure 7:
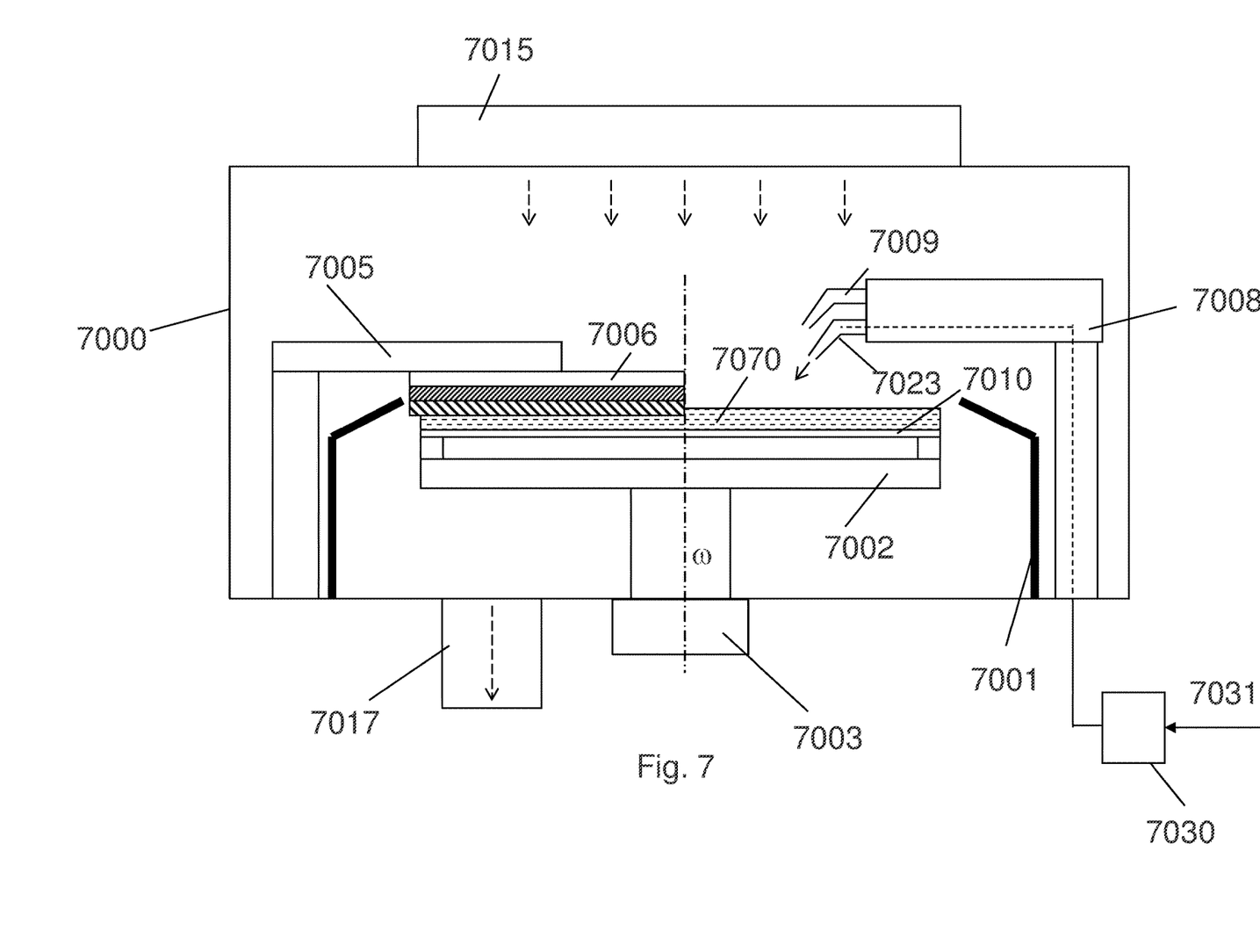
FIG. 7 depicts another exemplary apparatus for cleaning substrates according to the present invention.

FIG. 7 shows an apparatus for cleaning substrates according to another embodiment of the present invention. The apparatus is capable of pre-treating the substrate to obtain a bubble less or bubble-free surface of the substrates before the subsequent ultra/mega sonic cleaning process. The apparatus combines the pre-wet function and the cleaning function together in one chamber 7000, wherein the substrate is pre-treated for obtaining a bubble less or bubble-free pre-wetting surface of the substrate, and then cleaned by the subsequent ultra/mega sonic cleaning process. FIG. 7 shows the cleaning chamber 7000. The cleaning chamber 7000 comprises a cleaning cup 7001, a spin actuator 7003, a substrate holder 7002, a fan and filter unit 7015 to generate a down flow on the substrate 7010 surface, at least one exhaust port 7017 at the bottom of the cleaning cup 7001, a swing arm 7005 mounted with an ultra/mega sonic device 7006, a vaporized unit 7030 to vaporize the pre-wetting liquid chemical solution 7031 to vapor phase molecules, a plurality of nozzle arms 7008 mounted with at least one sprayer 7023 connected to the vaporized unit 7030 to dispense the vaporized liquid molecules to the substrate 7010 surface to form a bubble less or bubble-free pre-wetting chemical liquid layer on the substrate 7010 and at least one nozzle 7009 to supply cleaning chemical solution or chemical mist, and drying gas to the substrate 7010 surface. In one embodiment, pluralities of sprayers 7023 are used for the vaporized liquid molecules uniform distribution on the substrate 7010 surface. The vaporized unit 7030 is used for vaporizing the liquid phase pre-wetting chemical solution 7031 to gas molecules. In one embodiment, the vaporized unit 7030 transforms the pre-wetting chemical solution 7031 to gas phase molecules by a sonic generating method. In another embodiment, the vaporized unit 7030 transforms the pre-wetting chemical solution 7031 to gas phase molecules by a thermal heating method. And the vaporized liquid molecules also can be carried by some media gas such as $N_2$, air, ozone, $NH_3$, $H_2$ and He etc. The carrying gas could be noble gas only for the vaporized liquid molecules carrying or active gas to assist the vaporized liquid molecules for the substrate 7010 surface oxidation or passivation.

The vaporized liquid molecules are easier to be transported from bulk vapor environment into patterned structures such as vias and trenches and the like on the surface of the substrate 7010. After the vaporized liquid molecules are dispensed on the substrate 7010 surface, the vaporized liquid molecules condense on the substrate 7010 surface to form a thin layer 8020 of pre-wetting liquid molecules, and the liquid molecules formation layer by layer from bottom to top in the vias and trenches on the substrate 7010 surface as shown in FIGS. 8A to 8B. However, this bottom-up liquid layers formation of the pre-wetting chemical molecules will be affected if the portion of the substrate 7010 surface is not wetted well, and the liquid layer will break apart at said portion due to the surface tension. In one embodiment, the liquid phase pre-wetting chemical solution containing the surfactant or additives is vaporized in the vaporized unit

7030 to the vaporized mixture liquid molecules containing the molecules of surfactant or additives. The vaporized mixture liquid molecules containing the molecules of surfactant or additives are capable of increasing the wettability of the liquid chemical solution on the substrate surface, so as to fill up the vias and trenches, etc. patterned structures on the substrate 7010 with the liquid chemical solution in a bottom-up way without blockage of bubbles. The chemical such as carboxyl-containing ethylendiamine tetraacetic acid (EDTA), tetracarboxyl compound-ethylenediamine tetrapropionic (EDTP) acid/salt, etc. is used as a surfactant doped in the liquid chemical solution to increase the wettability of the liquid chemical solution. In another embodiment, the liquid phase pre-wetting chemical solution containing a chemical for oxidizing the substrate 7010 surface from the hydrophobic to hydrophilic is vaporized in the vaporized unit 7030 to the vaporized mixture liquid molecules. The vaporized mixture liquid molecules are capable of increasing the wettability of the liquid chemical solution on the substrate surface, so as to fill up the vias and trenches, etc. patterned structures on the substrate 7010 with the liquid chemical solution in a bottom-up way without blockage of bubbles. The chemical such as Ozone solution or SC1 solution ($NH_4OH$, $H_2O_2$, $H_2O$ mixture) is used to oxidize the hydrophobic surface material like Silicon or Ploy Silicon layer to hydrophilic Silicon oxide layer.

Another method for cleaning substrates according to the present invention, comprising:

Step 1: transfer a substrate 7010 into the cleaning chamber 7000, and the substrate 7010 is held by the substrate holder 7002.

Step 2: spin the substrate at a set low rotation speed from 10 RPM to 1000 RPM.

Step 3: supply the pre-wetting chemical solution to the vaporized unit 7030 for generation of the vaporized liquid molecules.

Step 4: swing the nozzle arm 7008 to a position above the surface of the substrate 7010 and apply the sprayers 7023 to dispense the vaporized liquid molecules on the substrate 7010 surface for the pre-wetting process.

Step 5: apply the nozzle 7009 to supply the cleaning chemical solution on the substrate 7010 surface. A plurality of chemical solutions can be used in this step.

Step 6: supply the cleaning chemical solution on the substrate 7010 surface for ultra/mega sonic cleaning process.

Step 7: move down the ultra/mega sonic device 7006 to the substrate 7010 surface with certain height, and the gap between the ultra/mega sonc device 7006 and the substrate 7010 surface is filled with cleaning chemical solution 7070 as a sonic transferring media.

Step 8: turn on the ultra/mega sonic device 7006 to clean the substrate 7010 surface with a programed recipe at a certain time.

Step 9: turn off the ultra/mega sonic device 7006 and lift up the ultra/mega sonic device 7006.

Step 10: supply rinse chemical solution or DI water on the substrate 7010 for cleaning.

Step 11: dry the substrate 7010.

Step 12: stop the substrate 7010 rotation and get the substrate 7010 from the cleaning chamber 7000.

The step 2 to step 4 are target for obtaining a bubble less or bubble-free pre-wetting process. The vaporized liquid molecules are dispensed on the substrate 7010 surface, and the vaporized liquid molecules condense on the substrate 7010 surface to form a thin layer of pre-wetting liquid molecules, and the liquid molecules formation layer by layer from bottom to top in the vias and trenches on the substrate 7010 surface.

The step 6 to step 9 can be repeated with at least one cycle. And at least one type of chemical solution such as SC1, ozone water, ammonia can be used in this cleaning cycle.

In the cleaning steps from step 5 to step 10, the substrate 7010 rotation speed can be set from 10 RPM to 1500 RPM by various time and controlled by programmable recipe.

Figure 9A:
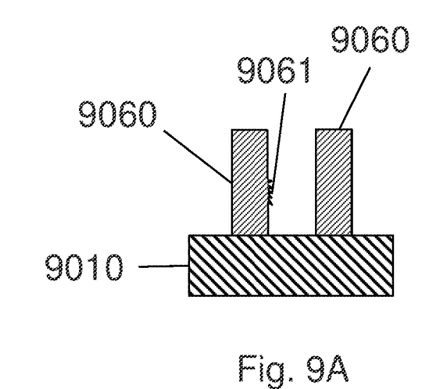
FIG. 9A to FIG. 9D depict another exemplary method for cleaning substrates according to the present invention.
Figure 9B:
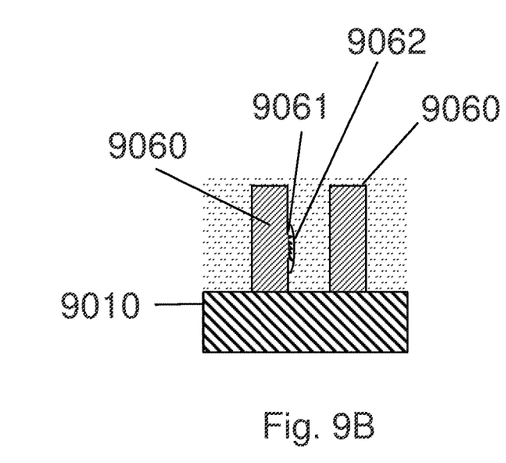
Figure 9C:
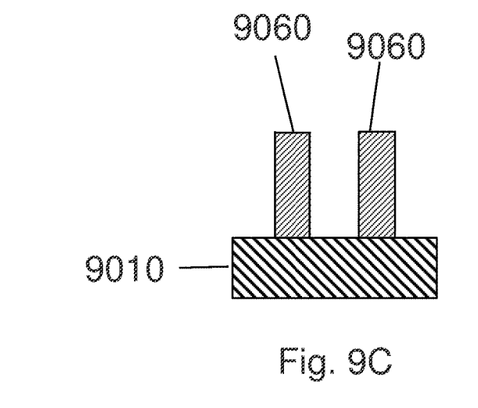
Figure 9D:
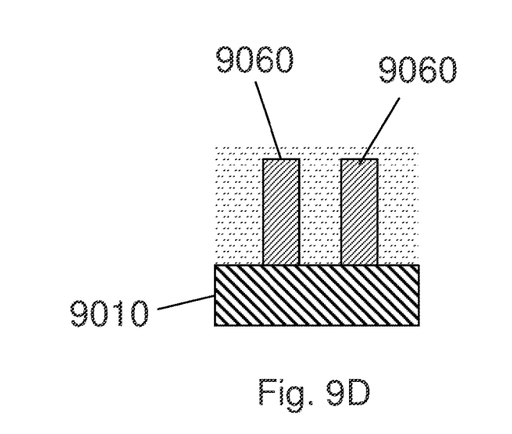

FIGS. 9A to 9B show a substrate 9010 having patterned structures 9060 with some scums or burrs 9061 in the recessed areas of the substrate 9010. Bubbles 9062 will accumulate around the areas with the scums or burrs 9061 during the pre-wetting process and the subsequent cleaning process, which may cause the patterned structures 9060 being damaged as shown in FIG. 2A in the ultra/mega sonic cleaning process. Therefore, it is preferable to use a descum unit to remove the scums or burrs 9061 to obtain a smoothing surface of the patterned structures 9060 as shown in FIG. 9C before implementing a bubble less or bubble-free pre-wetting process. In this case, the pre-wetting process without bubble trapping the scums or burrs surface as shown in FIG. 9D. In an embodiment, using the plasma with high energy to remove the scums or burrs 9061 on the patterned structures 9060 to reform a smoothing surface of the patterned structures. And then transfer the substrate 9010 to a pre-wet chamber for the bubble less or bubble-free pre-wetting process and to a cleaning chamber for the ultra/mega sonic cleaning process.

What is claimed is:

1. A method for cleaning substrates, comprising: placing a substrate on a substrate holder; implementing a pre-wetting process to form a bubble less or bubble-free liquid layer on the substrate, wherein the bubble less or bubble-free pre-wetting process comprises evaporating a pre-wetting chemical solution to a chemical liquid vapor, using a media gas to carry the chemical liquid vapor, and then guiding the chemical liquid vapor onto a surface of the substrate to form a pre-wetting chemical liquid layer on the substrate; and implementing an ultra or mega sonic cleaning process for cleaning the substrate after the pre-wetting process, wherein the method further-comprises using plasma to remove scums and burrs to obtain a smooth surface in recessed areas of the substrate prior to implementing the pre-wetting process for the substrate, and wherein the scums and burrs attract a bubble.

2. The method as claimed in claim 1, wherein the pre-wetting chemical solution is evaporated by a sonic generating method.

3. The method as claimed in claim 1, further comprising heating the chemical liquid vapor to a temperature higher than the temperature of the substrate.

4. The method as claimed in claim 1, further comprising cooling the substrate to a temperature lower than the temperature of the chemical liquid vapor.

5. The method as claimed in claim 1, wherein the pre-wetting chemical solution is evaporated by a thermal heating method.

6. The method as claimed in claim 1, wherein the pre-wetting chemical solution contains surfactants or additives.

7. The method as claimed in claim 6, wherein the surfactant is carboxyl-containing ethylendiamine tetraacetic acid, tetracarboxyl compound-ethylenediamine tetrapropionic acid, or tetracarboxyl compound-ethylenediamine tetrapropionic salt.

8. The method as claimed in claim 1, wherein the pre-wetting chemical solution contains an oxidizing chemical for oxidizing the substrate surface from hydrophobic to hydrophilic.

9. The method as claimed in claim 8, wherein the oxidizing chemical is Ozone solution or SC1 solution.

10. A method for cleaning substrates, comprising: placing a substrate on a substrate holder; implementing a pre-wetting process to form a bubble less or bubble-free liquid layer on the substrate, wherein the bubble less or bubble-free pre-wetting process comprises building a vacuum environment surrounding the substrate, and then supplying a pre-wetting chemical solution or a chemical mist onto the substrate; and implementing an ultra or mega sonic cleaning process for cleaning the substrate after the pre-wetting process, wherein the method further comprises using plasma to remove scums and burrs to obtain a smooth surface in recessed areas of the substrate prior to implementing the pre-wetting process for the substrate, and wherein the scums and burrs attract a bubble.

11. The method as claimed in claim 10, wherein the vacuum degree is set at 25 Torr and above.

* * * * *